United States Patent
Moteki et al.

(10) Patent No.: US 10,910,524 B2
(45) Date of Patent: Feb. 2, 2021

(54) LIGHT WAVELENGTH CONVERSION MEMBER AND LIGHT EMITTING DEVICE

(71) Applicant: NGK SPARK PLUG CO., LTD., Nagoya (JP)

(72) Inventors: Jun Moteki, Seto (JP); Shohei Takaku, Komaki (JP); Yusuke Katsu, Komaki (JP); Takeshi Mitsuoka, Konan (JP); Tsuneyuki Ito, Aichi (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 16/342,621

(22) PCT Filed: Oct. 20, 2017

(86) PCT No.: PCT/JP2017/037914
§ 371 (c)(1),
(2) Date: Apr. 17, 2019

(87) PCT Pub. No.: WO2018/079419
PCT Pub. Date: May 3, 2018

(65) Prior Publication Data
US 2019/0245118 A1 Aug. 8, 2019

(30) Foreign Application Priority Data

Oct. 28, 2016 (JP) .................. 2016-211843
Nov. 2, 2016 (JP) .................. 2016-215303

(51) Int. Cl.
*H01L 33/50* (2010.01)
*H01L 33/48* (2010.01)
(Continued)

(52) U.S. Cl.
CPC ............ *H01L 33/502* (2013.01); *C04B 35/50* (2013.01); *C09K 11/08* (2013.01); *G02B 5/20* (2013.01);
(Continued)

(58) Field of Classification Search
CPC ....................................... H01L 33/50
See application file for complete search history.

(56) References Cited

U.S. PATENT DOCUMENTS

2002/0003233 A1\* 1/2002 Mueller-Mach ...... H01L 33/504
257/84
2006/0124951 A1 6/2006 Sakata et al.
(Continued)

FOREIGN PATENT DOCUMENTS

EP 1 760 794 A1 3/2007
EP 1 837 921 A1 9/2007
(Continued)

OTHER PUBLICATIONS

International Search Report dated Jan. 23, 2018 issued by the International Searching Authority in counterpart International Application No. PCT/JP2017/037914 (PCT/ISA/210).
(Continued)

*Primary Examiner* — Omar F Mojaddedi
(74) *Attorney, Agent, or Firm* — Sughrue Mion, PLLC

(57) ABSTRACT

An optical wavelength conversion member and a light-emitting device including the optical wavelength conversion member. The light-emitting device (1) includes a container (3), a light-emitting element (5), and an optical wavelength conversion member (9). The optical wavelength conversion member (9) is composed of a polycrystalline ceramic sintered body containing, as main components, $Al_2O_3$ crystal grains and crystal grains of a component represented by formula $A_3B_5O_{12}$:Ce. Specifically, A and B of the $A_3B_5O_{12}$
(Continued)

individually represent at least one element selected from the following element groups: A: Sc, Y, and lanthanoids (except for Ce), and B: Al and Ga; the at least one element selected from the element groups is present in each crystal grain and the crystal grain boundary of the ceramic sintered body; and the element concentration of the crystal grain boundary is higher than the element concentration of the crystal grain.

5 Claims, 5 Drawing Sheets

(51) Int. Cl.
    *C04B 35/50*     (2006.01)
    *C04B 35/44*     (2006.01)
    *C04B 35/64*     (2006.01)
    *C09K 11/77*     (2006.01)
    *C09K 11/08*     (2006.01)
    *G02B 5/20*     (2006.01)

(52) U.S. Cl.
    CPC ...... *H01L 33/50* (2013.01); *C04B 2235/3222* (2013.01)

(56) References Cited

U.S. PATENT DOCUMENTS

| | | | |
|---|---|---|---|
| 2008/0187746 A1* | 8/2008 | De Graaf | C04B 35/6261 428/332 |
| 2009/0212697 A1 | 8/2009 | Nakamura et al. | |
| 2011/0181173 A1 | 7/2011 | De Graaf et al. | |
| 2012/0045634 A1 | 2/2012 | Irie et al. | |
| 2012/0194066 A1 | 8/2012 | Nakamura et al. | |
| 2013/0161849 A1* | 6/2013 | Wataya | C09K 11/645 264/21 |
| 2013/0256599 A1 | 10/2013 | Irie | |
| 2017/0088774 A1* | 3/2017 | Asai | H01L 33/502 |

FOREIGN PATENT DOCUMENTS

| | | |
|---|---|---|
| EP | 3 031 788 A1 | 6/2016 |
| JP | 4609319 B2 | 1/2011 |
| JP | 2011-513898 A | 4/2011 |
| JP | 5088977 B2 | 12/2012 |
| JP | 2013-209245 A | 10/2013 |
| JP | 5490407 B2 | 5/2014 |
| JP | 5650885 B2 | 1/2015 |
| JP | 5740017 B2 | 6/2015 |
| WO | 2015/141711 A1 | 9/2015 |

OTHER PUBLICATIONS

Communication dated Apr. 14, 2020 issued by the European Intellectual Property Office in counterpart European Application No. 17865089.1.

Communication dated Apr. 28, 2020, issued by the Korean Intellectual Property Office in counterpart Korean Application No. 10-2019-7010009.

* cited by examiner

US 10,910,524 B2

LIGHT WAVELENGTH CONVERSION MEMBER AND LIGHT EMITTING DEVICE

This application is a National Stage of International Application No. PCT/JP2017/037914 filed Oct. 20, 2017, claiming priority based on Japanese Patent Application No. 2016-211843, filed Oct. 28, 2016, and Japanese Patent Application No. 2016-215303, filed Nov. 2, 2016.

TECHNICAL FIELD

The present invention relates to an optical wavelength conversion member capable of converting light wavelength, and to a light-emitting device including the optical wavelength conversion member.

BACKGROUND ART

Recently, in headlights and other lighting apparatuses, white light is generally achieved through wavelength conversion, by use of a phosphor, of blue light emitted from a light-emitting diode (LED) or a laser diode (LD).

Such a phosphor is known to be used with a resin matrix, a glass matrix, or other matrices. However, in recent years, as the output of a light source increases, the phosphor is required to have higher durability. Thus, ceramic-based phosphors have received attention.

A typically known ceramic phosphor is a Ce-activated garnet ($A_3B_5O_{12}$) component, such as $Y_3Al_5O_{12}$:Ce (YAG:Ce).

Patent Document 1 discloses a technique involving formation of an $Al_2O_3$-YAG:Ce composite material exhibiting improved thermal resistance and thermal conductivity.

PRIOR ART DOCUMENTS

Patent Documents

Patent Document 1: Japanese Patent No. 4609319
Patent Document 2: Japanese Patent No. 5740017

SUMMARY OF THE INVENTION

Problem to be Solved by the Invention

The $Al_2O_3$-containing composite material formed through such a conventional technique has thermal conductivity higher than that of a single YAG:Ce component, and thus exhibits improved thermal resistance and laser power resistance. However, such a technique may encounter a problem described below.

For example, the technique disclosed in Patent Document 1 involves formation of a sintered body by means of unidirectional solidification. The technique can form only a sintered body having a composition of $Al_2O_3$/YAG:Ce (=55/45 by volume). The sintered body exhibits limited fluorescent properties (e.g., fluorescence intensity and color uniformity (no variation in color)).

The technique disclosed in Patent Document 2 involves $CeAl_{11}O_{18}$ segregation in a crystal in the course of production of a sintered body for preventing color unevenness due to uneven Ce concentration caused by Ce evaporation during firing. Since $CeAl_{11}O_{18}$ itself does not have fluorescent properties, the presence of the substance may cause loss of the fluorescent properties of the entire sintered body.

Since none of the aforementioned conventional techniques achieves control of small grain boundaries, the resultant ceramic phosphor exhibits fluorescent properties (e.g., fluorescence intensity and color uniformity) inferior to those of a conventional resin or glass phosphor.

In view of the foregoing, an object of the present invention is to provide an optical wavelength conversion member and a light-emitting device, each of which achieves compatibility between high fluorescence intensity and high color uniformity.

Means for Solving the Problem (1) A first aspect of the present invention is directed to an optical wavelength conversion member comprising a polycrystalline ceramic sintered body containing, as main components, $Al_2O_3$ crystal grains and crystal grains of a component represented by formula $A_3B_5O_{12}$:Ce (hereinafter may be referred to as $A_3B_5O_{12}$:Ce crystal grains).

In the optical wavelength conversion member, A and B of $A_3B_5O_{12}$ individually represent at least one element selected from the following element groups:

A: Sc, Y, and lanthanoids (except for Ce), and
B: Al and Ga; and the at least one element selected from the element groups is present in each crystal grain and the crystal grain boundary of the ceramic sintered body, and the element concentration of the crystal grain boundary is higher than the element concentration of the crystal grain.

As described above, in the optical wavelength conversion member according to the first aspect, a specific element is present in each crystal grain and the crystal grain boundary, and the element concentration of the crystal grain boundary is higher than that of the crystal grain. Thus, as shown in the Examples described hereinbelow, the optical wavelength conversion member achieves high fluorescence intensity and high color uniformity (i.e., a small variation in color).

Specifically, in the first aspect, the aforementioned specific element is present in a larger amount in the crystal grain boundary than in each crystal grain, and thus serves as an element source, which probably reduces concentration unevenness (i.e., a variation in color) caused by evaporation of the element during firing. This is obvious from the concentration distribution after firing.

The presence of the aforementioned element in the crystal grain boundary reduces reflection or refraction (birefringence), which would otherwise occur at a discontinuous interface (e.g., crystal grain boundary), and is less likely to cause a reduction in translucency due to excessive grain boundary scattering. This probably contributes to high fluorescence intensity.

The optical wavelength conversion member according to the first aspect, which has the aforementioned characteristic features, exhibits high thermal conductivity. Thus, even when a high-output light source is used, an undesired effect of heat on the optical wavelength conversion member can be prevented; for example, optical loss can be prevented.

Since the optical wavelength conversion member is formed of a ceramic sintered body, the optical wavelength conversion member is advantageous in that it exhibits high strength, is less likely to undergo performance degradation through repeated irradiation with light from a light source, and exhibits excellent weather resistance.

(2) In a second aspect of the present invention, the Ce concentration of the crystal grains of the component represented by $A_3B_5O_{12}$:Ce is 10.0 mol % or less (exclusive of 0) relative to the element A.

When the Ce concentration of the $A_3B_5O_{12}$:Ce crystal grains is 0 mol % relative to the element A, satisfactory fluorescence intensity is less likely to be achieved, whereas when the Ce concentration of the $A_3B_5O_{12}$:Ce crystal grains exceeds 10 mol %, concentration quenching may be likely to occur, resulting in low fluorescence intensity.

Thus, as in the case of the second aspect, the Ce concentration of the $A_3B_5O_{12}$:Ce crystal grains is preferably 10 mol % or less (exclusive of 0) relative to the element A, since high fluorescence intensity can be achieved.

(3) In a third aspect of the present invention, the ceramic sintered body contains the crystal grains of the component represented by $A_3B_5O_{12}$:Ce in an amount of 3 to 70 vol. %.

When the amount of the $A_3B_5O_{12}$:Ce crystal grains is less than 3 vol. %, satisfactory fluorescence intensity may be less likely to be achieved due to a small amount of the $A_3B_5O_{12}$:Ce crystal grains, whereas when the amount of the $A_3B_5O_{12}$:Ce crystal grains exceeds 70 vol. %, grain boundary scattering may increase at the heterogeneous interface; i.e., the interface between an $Al_2O_3$ crystal grain and an $A_3B_5O_{12}$:Ce crystal grain, resulting in unsatisfactory translucency (i.e., low fluorescence intensity).

Thus, as in the case of the third aspect, the amount of the $A_3B_5O_{12}$:Ce crystal grains is preferably 3 to 70 vol. %, since satisfactory translucency and high fluorescence intensity are achieved.

(4) In a fourth aspect of the present invention, there is provided a light-emitting device characterized by comprising an optical wavelength conversion member as recited in any of the aspect 1 to 3.

The light (i.e., fluorescence) having a wavelength converted by means of the light-emitting device (specifically, the optical wavelength conversion member) according to the fourth aspect exhibits high fluorescence intensity and high color uniformity.

The light-emitting device may include any known light-emitting element, such as an LED or LD.

Characteristic Features of the Present Invention Will Now be Described

The aforementioned "optical wavelength conversion member" is formed of a ceramic sintered body having the aforementioned characteristics. Crystal grains or the grain boundary therebetween may contain an unavoidable impurity.

The term "main components" described above refers to any component present in a predominant amount (volume) in the optical wavelength conversion member.

The term "$A_3B_5O_{12}$:Ce" described above refers to the case where a portion of A contained in $A_3B_5O_{12}$ is substituted by Ce through formation of a solid solution. The compound having such a structure exhibits fluorescent properties.

The term "concentration" described above may be indicated by any unit representing an amount (content), such as mol %, wt. %, or vol. %.

MODES FOR CARRYING OUT THE INVENTION

Next will be described embodiments of the optical wavelength conversion member and the light-emitting device of the present invention.

1. Embodiment 1-1. Light-Emitting Device

Now will be described a light-emitting device including an optical wavelength conversion member.

Figure 1:
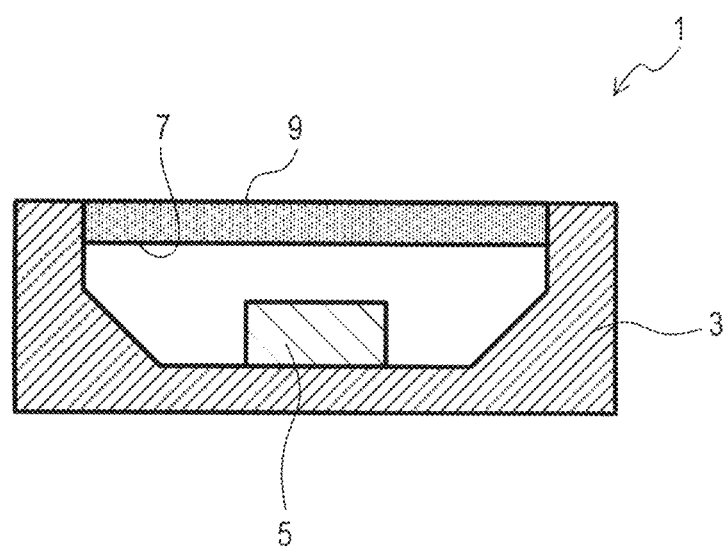
FIG. 1 is a cross-sectional view (in a thickness direction) of a light-emitting device including an optical wavelength conversion member.

As illustrated in FIG. 1, a light-emitting device 1 of the present embodiment includes a box-shaped ceramic package (container) 3 formed of, for example, alumina; a light-emitting element 5 (e.g., LD) disposed in the interior of the container 3; and a plate-like optical wavelength conversion member 9 disposed so as to cover an opening 7 of the container 3.

In the light-emitting device 1, light emitted from the light-emitting element 5 transmits through the translucent optical wavelength conversion member 9, and the wavelength of a portion of the emitted light is converted in the interior of the optical wavelength conversion member 9. Thus, the optical wavelength conversion member 9 emits fluorescence having a wavelength different from that of the light emitted from the light-emitting element 5.

For example, the optical wavelength conversion member 9 converts the wavelength of blue light emitted from an LD, whereby the optical wavelength conversion member 9 as a whole emits white light to the outside (e.g., upward in FIG. 1).

1-2. Optical Wavelength Conversion Member

The optical wavelength conversion member 9 will now be described.

The optical wavelength conversion member 9 of the present embodiment is composed of a ceramic sintered body formed of a polycrystalline body containing, as main components, $Al_2O_3$ crystal grains and crystal grains of a component represented by formula $A_3B_5O_{12}$:Ce (i.e., $A_3B_5O_{12}$:Ce crystal grains).

In the optical wavelength conversion member 9, A and B of $A_3B_5O_{12}$ individually represent at least one element selected from the following element groups:

A: Sc, Y, and lanthanoids (except for Ce), and

B: Al and Ga; at least one element selected from the element groups is present in each crystal grain and the crystal grain boundary; and the element concentration of the crystal grain boundary is higher than the element concentration of the crystal grain.

In the optical wavelength conversion member 9 of the present embodiment, the Ce concentration of the $A_3B_5O_{12}$:Ce crystal grains may be 10.0 mol % or less (exclusive of 0) relative to the element A.

In the optical wavelength conversion member 9 of the present embodiment, the ceramic sintered body may contain the $A_3B_5O_{12}$:Ce crystal grains in an amount of 3 to 70 vol. %.

1-3. Effects

The effects of the present embodiment will now be described.

In the optical wavelength conversion member 9 of the present embodiment, a specific element is present in each crystal grain and the crystal grain boundary, and the element concentration of the crystal grain boundary is higher than that of the crystal grain. Thus, the optical wavelength conversion member 9 achieves high fluorescence intensity and high color uniformity (i.e., a small variation in color).

The optical wavelength conversion member 9 of the present embodiment exhibits high thermal conductivity. Thus, even when a high-output light source is used, an undesired effect of heat on the optical wavelength conversion member 9 can be prevented; for example, optical loss can be prevented.

Since the optical wavelength conversion member 9 of the present embodiment is formed of a ceramic sintered body, the optical wavelength conversion member 9 is advantageous in that it exhibits high strength, is less likely to undergo performance degradation through repeated irradiation with light from a light source, and exhibits excellent weather resistance.

The Ce concentration of the $A_3B_5O_{12}$:Ce crystal grains is preferably 10 mol % or less (exclusive of 0) relative to the element A, since high fluorescence intensity can be achieved.

The amount of the $A_3B_5O_{12}$:Ce crystal grains in the ceramic sintered body is advantageously 3 to 70 vol. %, since satisfactory translucency and high fluorescence intensity are achieved.

Thus, the light-emitting device 1 including the optical wavelength conversion member 9 can effectively emit fluorescence having high fluorescence intensity and high color uniformity.

2. EXAMPLES

The present invention will next be described in detail by way of Examples.

2-1. Examples 1 to 3

Example 1

Ceramic sintered body samples (Nos. 1 to 4) were prepared under the conditions shown in Table 1. Samples Nos. 1 to 3 fall within the scope of the present invention, and sample No. 4 falls outside the scope of the present invention (Comparative Example).

Specifically, for preparation of each sample, $Al_2O_3$ powder (mean particle size: 0.3 μm), $Y_2O_3$ powder (mean particle size: 1.2 μm), and $CeO_2$ powder (mean particle size: 1.5 μm) were weighed so that the amount of YAG ($Y_3Al_5O_{12}$) was 21 vol. % in a ceramic sintered body (i.e., a ceramic sintered body forming an optical wavelength conversion member) and the Ce concentration was 1 mol % relative to Y in the YAG.

These powders were added to a ball mill together with an organic solvent and a specific amount of a dispersant (2 wt. % in terms of solid content, relative to the raw material powders), and these materials were grind-mixed for 12 hours.

The grind-mixing was performed through the following procedure.

Firstly, each powder material was prepared by any of the following processes (1) to (4):

(1) 10-hr grind-mixing of only $Al_2O_3$;
(2) 10-hr grind-mixing of $Al_2O_3$ and $CeO_2$;
(3) 10-hr grind-mixing of $Y_2O_3$ and $CeO_2$; and
(4) 10-hr grind-mixing of $Al_2O_3$, $Y_2O_3$, and $CeO_2$.

The powders prepared in (1) to (4) above were mixed and ground under the conditions described below, to thereby prepare slurries A to D.

A: slurry produced by mixing of the powders prepared in the processes (1) and (4) and 2-hr additional mixing.

B: slurry produced by mixing of the powders prepared in the processes (2) and (4) and 2-hr additional mixing.

C: slurry produced by mixing of the powders prepared in the processes (2), (3), and (4) and 2-hr additional mixing.

D: slurry produced by 2-hr additional mixing and grinding of the powder prepared in the process (4).

Subsequently, as shown in Table 1, each of the slurries was formed into a sheet compact by means of doctor blading. The sheet compact was degreased and then fired in an air atmosphere at 1,450° C. to 1,750° C. for 3 to 20 hours. Thus, ceramic sintered body samples Nos. 1 to 4 were prepared. Each ceramic sintered body had dimensions of 20 mm×20 mm×0.5 mm (thickness).

Examples of the usable dispersant include polycarboxylate dispersants, such as SN Dispersant 5468 (product of San Nopco Limited) and MALIALIM AKM-0531 (product of NOF Corporation).

Subsequently, the prepared ceramic sintered bodies were examined for the following properties (a) to (e) in the same manner as in other examples described below. The results are shown in Table 1.

(a) Relative Density

The density of each ceramic sintered body was measured by the Archimedes method, and the measured density was converted into a relative density.

(b) Crystal Grain Boundary Component

In each sample, a slice (100 nm×100 nm) was cut out of a certain portion of the ceramic sintered body (e.g., a center portion of the sintered body) by means of a focused ion beam (FIB) system. A specific surface of the slice (e.g., a center portion of the slice) was targeted for observation.

The specific surface of each sample was observed under a scanning transmission electron microscope (STEM), to thereby determine crystal grain boundaries.

Subsequently, in each sample having the determined crystal grain boundaries, the Ce concentrations of each crystal grain and the crystal grain boundary were measured by means of an energy dispersive X-ray spectrometer (EDS), to thereby determine the presence or absence of elemental Ce.

Specifically, as illustrated below in FIGS. 2 to 5, a specific straight-line region (i.e., analysis distance) was provided so as to include a crystal grain boundary and the interiors of crystal grains located on opposite sides of the crystal grain boundary for determining the Ce concentrations of the crystal grains and the crystal grain boundary. The Ce concentration was then continuously measured within the specific region (i.e., line analysis was performed).

(c) Fluorescence Intensity

Each sample was processed into a shape of 13 mm×13 mm×0.5 mm (thickness). Blue LD light (wavelength: 465 nm) was focused to a width of 0.5 mm by means of a lens, and the processed sample was irradiated with the focused light. The light transmitting through the sample was focused by means of a lens, and the emission intensity was measured by means of a power sensor. The sample was irradiated with the light at a power density 40 W/mm$^2$. The emission intensity was evaluated by a value relative to that (taken as 100) of a YAG:Ce single-crystal body.

(e) Variation in Color

Variation in color was evaluated through determination of a variation in chromaticity by means of an illuminometer.

Specifically, each sample was processed into a shape of 20 mm×20 mm×0.5 mm (thickness). Blue LD light (wavelength: 462 nm) was focused to a width of 0.4 mm by means of a lens, and the sample was irradiated with the focused light. A color illuminometer was used to determine the chromaticity of the light transmitting through the surface of the sample opposite the surface irradiated with the focused light.

The light irradiation was performed on a 18 mm square region (at intervals of 3 mm in the region) at the center of the irradiation surface of the sample (sample surface), and a variation in chromaticity (in X-direction) ($\Delta X$) was evaluated. As used herein, the term "variation ($\Delta X$)" refers to the maximum deviation of chromaticity (in X-direction).

The above-determined fluorescence intensity and variation in color of each sample can be evaluated on the basis of the following criteria. Samples of other examples can be evaluated in the same manner.

The fluorescence intensity is preferably 120 or more. The variation in color $\Delta X$ is preferably less than 0.015.

Next will be described the results of evaluation of the samples of Example 1 on the basis of the aforementioned criteria.

All the samples of Example 1 exhibited a relative density of 99% or more; i.e., the samples were sufficiently densified.

As shown in Table 1, samples Nos. 1 to 3, in which elemental Ce was present in a larger amount in crystal grain boundaries than in crystal grains, exhibited good results; i.e., high fluorescence intensity and a small variation in color. In contrast, sample No. 4, in which the difference in Ce concentration was small between crystal grains and crystal grain boundaries, exhibited low fluorescence intensity and a large variation in color.

In Table 1, "$Al_2O_3$—$Al_2O_3$" refers to the grain boundary between an $Al_2O_3$ crystal grain and an $Al_2O_3$ crystal grain; "$Al_2O_3$-$A_3B_5O_{12}$" refers to the grain boundary between an $Al_2O_3$ crystal grain and an $A_3B_5O_{12}$:Ce crystal grain; and "$A_3B_5O_{12}$-$A_3B_5O_{12}$" refers to the grain boundary between an $A_3B_5O_{12}$:Ce crystal grain and an $A_3B_5O_{12}$:Ce crystal grain. The "presence" in a grain boundary refers to the case where the grain boundary showed the maximum Ce concentration peak as determined through line analysis; i.e., the Ce concentration of the crystal grain boundary was higher than that of crystal grains.

Example 2

As shown in Table 1, ceramic sintered body samples (samples Nos. 5 to 14) were prepared and evaluated in the same manner as in Example 1.

The proportions of the raw materials were changed so that the Ce concentration was adjusted to 0 to 15 mol % relative to Y of $A_3B_5O_{12}$ (YAG) in the ceramic sintered body.

All the samples exhibited a relative density of 99% or more; i.e., the samples were sufficiently densified.

Elemental Ce was found to be present in a larger amount in crystal grain boundaries than in crystal grains.

Samples Nos. 6 to 12, in which the Ce concentration was 10 mol % or less (exclusive of 0), exhibited good results in terms of fluorescence intensity and variation in color.

In contract, sample No. 5, which contained no Ce, failed to be evaluated for fluorescence intensity and variation in color.

Samples Nos. 13 and 14, which had high Ce concentration, exhibited low fluorescence intensity.

Example 3

As shown in Table 1, ceramic sintered body samples (samples Nos. 15 to 22) were prepared and evaluated in the same manner as in Example 1.

The proportions of the raw materials were changed so that the $A_3B_5O_{12}$:Ce content (YAG:Ce content) was adjusted to 1 to 80 vol. % in the ceramic sintered body.

All the samples exhibited a relative density of 99% or more; i.e., the samples were sufficiently densified.

Elemental Ce was found to be present in a larger amount in crystal grain boundaries than in crystal grains.

Samples Nos. 16 to 21, in which the YAG:Ce content was 1 to 70 vol. %, exhibited good results in terms of fluorescence intensity and variation in color.

In contrast, sample No. 15 (low YAG:Ce content) and sample No. 22 (high YAG:Ce content) exhibited low fluorescence intensity and a relatively large variation in color.

Example 4

As shown in Table 1, ceramic sintered body samples (samples Nos. 23 to 43) were prepared and evaluated in the same manner as in Example 1.

$Y_2O_3$ powder was used in combination with at least one of $Lu_2O_3$ powder (mean particle size: 1.3 μm), $Yb_2O_3$ powder (mean particle size: 1.5 μm), $Gd_2O_3$ powder (mean particle size: 1.5 μm), $Tb_2O_3$ powder (mean particle size: 1.6 μm), and $Ga_2O_3$ powder (mean particle size: 1.3 μm). During mixing of the raw materials, the proportions of the raw materials were varied so that specific $A_3B_5O_{12}$:Ce was synthesized.

All the samples exhibited a relative density of 99% or more; i.e., the samples were sufficiently densified.

Elemental Ce was found to be present in a larger amount in crystal grain boundaries than in crystal grains.

All the samples exhibited good results in terms of fluorescence intensity and variation in color.

TABLE 1

| | No. | A3B5O12 Composition | Mixing-Grinding Cond. | Presence of Ce Al2O3-Al2O3 | Presence of Ce Al2O3-A3B5O12 | Presence of Ce A3B5O12-A3B5O12 | Al2O3 Cont. (vol %) | A3B5O12:Ce (vol %) | Ce Conc. (mol %) | Fluorescence Intensity | Variation in Color ΔX |
|---|---|---|---|---|---|---|---|---|---|---|---|
| Ex. 1 | 1 | Y3Al5O12 | A | YES | YES | — | 79 | 21 | 1 | 130 | 0.007 |
| | 2 | Y3Al5O12 | B | — | YES | YES | 79 | 21 | 1 | 135 | 0.009 |
| | 3 | Y3Al5O12 | C | YES | YES | YES | 79 | 21 | 1 | 145 | 0.005 |
| | 4 | Y3Al5O12 | D | — | — | — | 79 | 21 | 1 | 80 | 0.026 |
| Ex. 2 | 5 | Y3Al5O12 | — | — | — | — | 79 | 21 | 0 | — | — |
| | 6 | Y3Al5O12 | C | YES | YES | YES | 79 | 21 | 0.005 | 122 | 0.014 |
| | 7 | Y3Al5O12 | C | YES | YES | YES | 79 | 21 | 0.1 | 134 | 0.011 |
| | 8 | Y3Al5O12 | C | YES | YES | YES | 79 | 21 | 0.3 | 142 | 0.009 |
| | 9 | Y3Al5O12 | C | YES | YES | YES | 79 | 21 | 0.5 | 145 | 0.008 |
| | 10 | Y3Al5O12 | C | YES | YES | YES | 79 | 21 | 1 | 145 | 0.007 |
| | 11 | Y3Al5O12 | C | YES | YES | YES | 79 | 21 | 3 | 135 | 0.009 |
| | 12 | Y3Al5O12 | C | YES | YES | YES | 79 | 21 | 5 | 122 | 0.013 |
| | 13 | Y3Al5O12 | C | YES | YES | YES | 79 | 21 | 10 | 85 | 0.024 |
| | 14 | Y3Al5O12 | C | YES | YES | YES | 79 | 21 | 15 | 53 | 0.025 |
| Ex. 3 | 15 | Y3Al5O12 | C | YES | YES | YES | 87 | 1 | 1 | 116 | 0.016 |
| | 16 | Y3Al5O12 | C | YES | YES | YES | 95 | 3 | 1 | 120 | 0.014 |
| | 17 | Y3Al5O12 | C | YES | YES | YES | 80 | 20 | 0.4 | 138 | 0.008 |
| | 18 | Y3Al5O12 | C | YES | YES | YES | 75 | 25 | 0.4 | 137 | 0.007 |
| | 19 | Y3Al5O12 | C | YES | YES | YES | 70 | 40 | 0.4 | 135 | 0.006 |
| | 20 | Y3Al5O12 | C | YES | YES | YES | 40 | 60 | 1 | 126 | 0.008 |
| | 21 | Y3Al5O12 | C | YES | YES | YES | 30 | 70 | 1 | 122 | 0.011 |
| | 22 | Y3Al5O12 | C | YES | YES | YES | 20 | 80 | 1 | 115 | 0.017 |
| Ex. 4 | 23 | Lu3Al5O12 | C | YES | YES | YES | 85 | 15 | 0.5 | 140 | 0.005 |
| | 24 | Lu3Al5O12 | C | YES | YES | YES | 79 | 21 | 0.5 | 142 | 0.006 |
| | 25 | Lu3Al5O12 | C | YES | YES | YES | 60 | 40 | 0.5 | 145 | 0.007 |
| | 26 | Y1.5Lu1.5Al5O12 | C | YES | YES | YES | 85 | 15 | 0.5 | 134 | 0.006 |
| | 27 | Y1.5Lu1.5Al5O12 | C | YES | YES | YES | 79 | 21 | 0.5 | 137 | 0.005 |
| | 28 | Y1.5Lu1.5Al5O12 | C | YES | YES | YES | 60 | 40 | 0.5 | 140 | 0.006 |
| | 29 | Yb3Al5O12 | C | YES | YES | YES | 85 | 15 | 0.5 | 139 | 0.005 |
| | 30 | Yb3Al5O12 | C | YES | YES | YES | 79 | 21 | 0.5 | 140 | 0.007 |
| | 31 | Yb3Al5O12 | C | YES | YES | YES | 60 | 40 | 0.5 | 142 | 0.009 |
| | 32 | Y1.5Gd1.5Al5O12 | C | YES | YES | YES | 85 | 15 | 0.5 | 141 | 0.005 |
| | 33 | Y1.5Gd1.5Al5O12 | C | YES | YES | YES | 79 | 21 | 0.5 | 142 | 0.006 |
| | 34 | Y1.5Gd1.5Al5O12 | C | YES | YES | YES | 60 | 40 | 0.5 | 145 | 0.008 |
| | 35 | Y1.5Yb1.5Al5O12 | C | YES | YES | YES | 85 | 15 | 0.5 | 140 | 0.005 |
| | 36 | Y1.5Yb1.5Al5O12 | C | YES | YES | YES | 79 | 21 | 0.5 | 142 | 0.005 |
| | 37 | Y1.5Yb1.5Al5O12 | C | YES | YES | YES | 60 | 40 | 0.5 | 144 | 0.007 |
| | 38 | Y1.5Tb1.5Al5O12 | C | YES | YES | YES | 85 | 15 | 0.5 | 141 | 0.006 |
| | 39 | Y1.5Tb1.5Al5O12 | C | YES | YES | YES | 79 | 21 | 0.5 | 143 | 0.007 |
| | 40 | Y1.5Tb1.5Al5O12 | C | YES | YES | YES | 60 | 40 | 0.5 | 146 | 0.008 |
| | 41 | Y3Al4Ga1O12 | C | YES | YES | YES | 85 | 15 | 0.5 | 132 | 0.007 |
| | 42 | Y3Al4Ga1O12 | C | YES | YES | YES | 79 | 21 | 0.5 | 134 | 0.006 |
| | 43 | Y3Al4Ga1O12 | C | YES | YES | YES | 60 | 40 | 0.5 | 136 | 0.009 |

2-2. Line Analysis

The aforementioned line analysis and the results thereof will now be described.

Figure 2A:
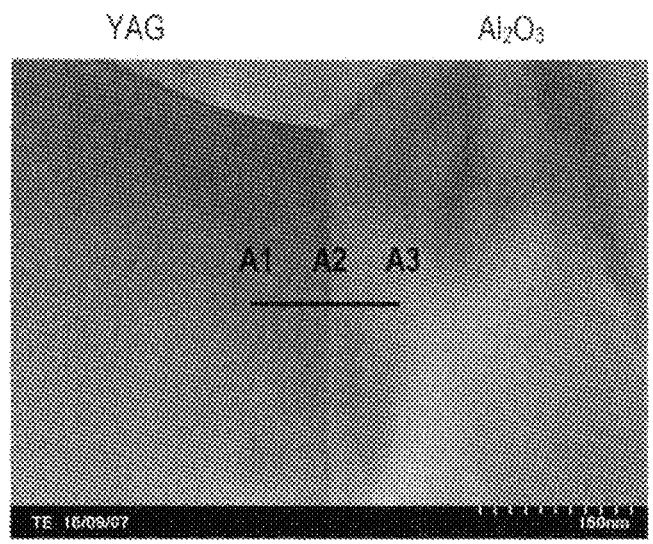
FIG. 2A is a BF-STEM image of sample No. 3.

FIG. 2A is a BF-STEM image (magnification: ×200,000) of sample No. 3. As illustrated in FIG. 2A, the aforementioned line analysis was performed in a linear region traversing "YAG (i.e., YAG crystal grain)-crystal grain boundary-Al$_2$O$_3$ (i.e., Al$_2$O$_3$ crystal grain)."

Figure 2B:
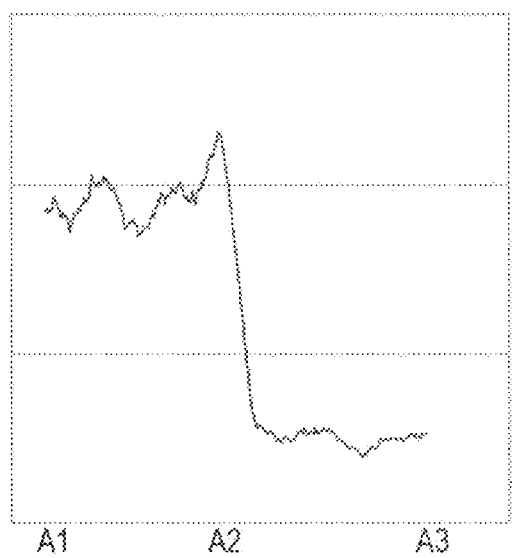
FIG. 2B is a graph showing a change in concentration in the sample of FIG. 2A as determined through line analysis.

The results of the analysis are shown in FIG. 2B. The Ce concentration is higher at the crystal grain boundary than in each of the crystal grains located on opposite sides of the crystal grain boundary.

The horizontal axis of the graph of FIG. 2B corresponds to the positions on the straight line traversing the crystal grain boundary shown in FIG. 2A; i.e., position A1 in YAG (YAG crystal grain), position A2 at the crystal grain boundary, and position A3 in Al$_2$O$_3$ (i.e., Al$_2$O$_3$ crystal grain). The distance between position A1 and position A3 is about 100 nm. The vertical axis of the graph corresponds to Ce concentration. The same shall apply hereinafter in another line analysis, except that the position symbols "A1, A2, and A3" are replaced with "B1, B2, and B3," "C1, C2, and C3," or "D1, D2, and D3."

Figure 3A:
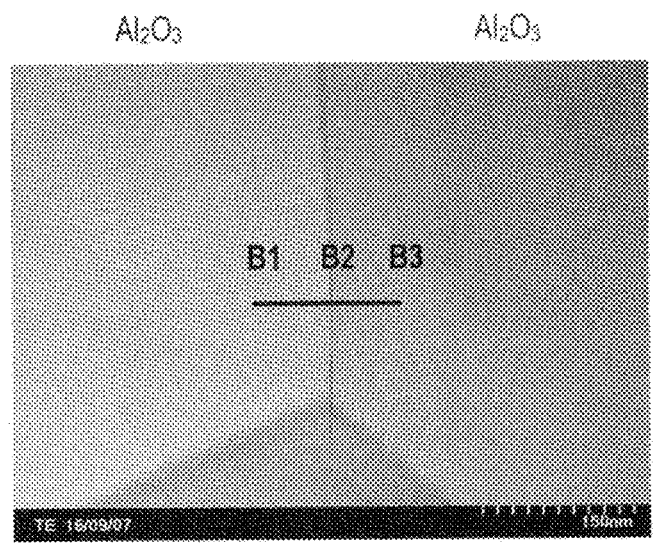
FIG. 3A is a BF-STEM image of sample No. 8.

FIG. 3A is a BF-STEM image (magnification: ×200,000) of sample No. 8. As illustrated in FIG. 3A, the aforementioned line analysis was performed in a linear region traversing "Al$_2$O$_3$-crystal grain boundary-Al$_2$O$_3$" (B1-B2-B3).

Figure 3B:
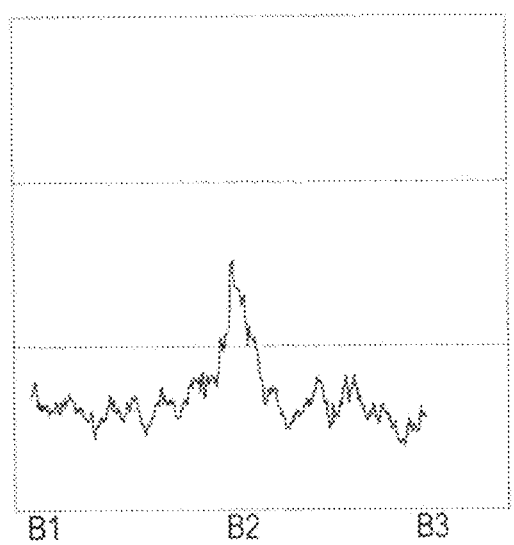
FIG. 3B is a graph showing a change in concentration in the sample of FIG. 3A as determined through line analysis.

The results of the analysis are shown in FIG. 3B. The Ce concentration is higher at the crystal grain boundary than in each of the crystal grains located on opposite sides of the crystal grain boundary.

Figure 4A:
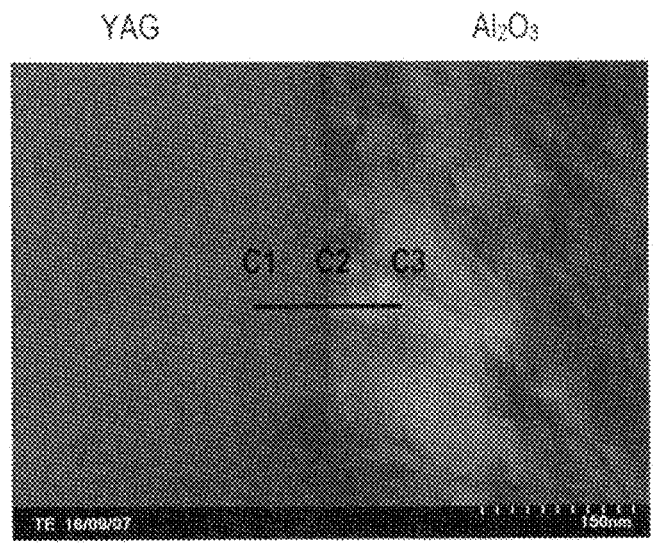
FIG. 4A is a BF-STEM image of sample No. 18.

FIG. 4A is a BF-STEM image (magnification: ×200,000) of sample No. 18. As illustrated in FIG. 4A, the aforementioned line analysis was performed in a linear region traversing "YAG-crystal grain boundary-Al$_2$O$_3$" (C1-C2-C3).

Figure 4B:
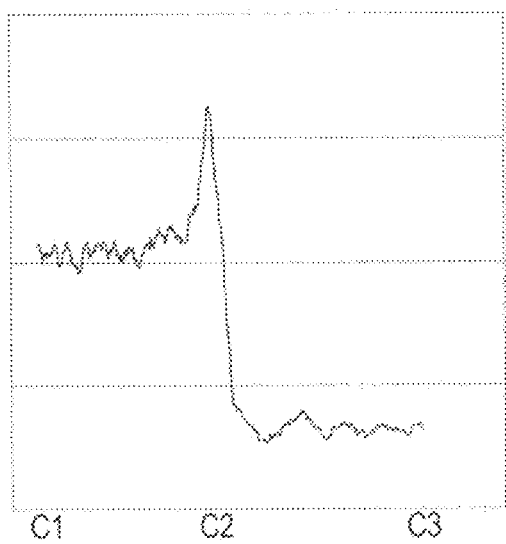
FIG. 4B is a graph showing a change in concentration in the sample of FIG. 4A as determined through line analysis.

The results of the analysis are shown in FIG. 4B. The Ce concentration is higher at the crystal grain boundary than in each of the crystal grains located on opposite sides of the crystal grain boundary.

Figure 5A:
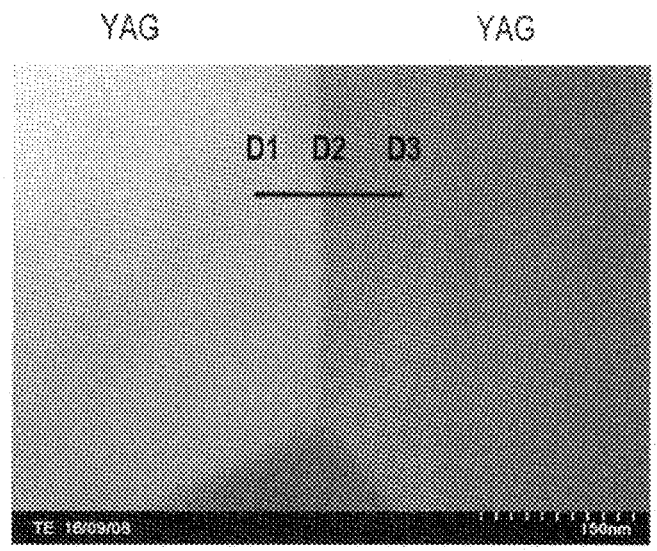
FIG. 5A is a BF-STEM image of sample No. 20.

FIG. 5A is a BF-STEM image (magnification: ×200,000) of sample No. 20. As illustrated in FIG. 5A, the aforementioned line analysis was performed in a linear region traversing "YAG-crystal grain boundary-YAG" (D1-D2-D3).

Figure 5B:
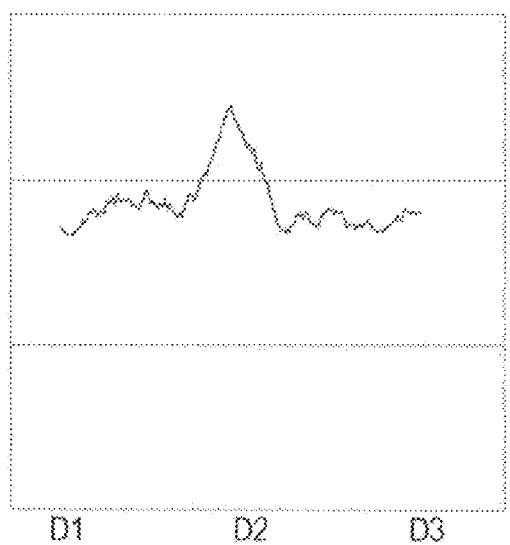
FIG. 5B is a graph showing a change in concentration in the sample of FIG. 5A as determined through line analysis.

The results of the analysis are shown in FIG. 5B. The Ce concentration is higher at the crystal grain boundary than in each of the crystal grains located on opposite sides of the crystal grain boundary.

3. Other Embodiments

Needless to say, the present invention is not limited to the aforementioned embodiment, but may be implemented in various other forms without departing from the scope of the invention.

(1) For example, the aforementioned embodiment involves the use of a firing process performed in air at ambient pressure. However, a vacuum firing process, a reducing-atmosphere firing process, a hot pressing (HP) process, a hot isostatic pressing (HIP) process, or any combination of these processes may be used for the preparation of a sample having the same properties as those described in the embodiment.

(2) The aforementioned optical wavelength conversion member or light-emitting device can be used for various applications, including fluorescent bodies, optical wavelength conversion apparatuses, head lamps, lighting apparatuses, and optical apparatuses (e.g., projectors).

(3) The components of the aforementioned embodiment may be appropriately combined.

DESCRIPTION OF REFERENCE NUMERALS

1: light-emitting device; 5: light-emitting element; and 9: optical wavelength conversion member

The invention claimed is:

1. An optical wavelength conversion member comprising a polycrystalline ceramic sintered body containing, as main components, $Al_2O_3$ crystal grains and crystal grains of a component represented by formula $A_3B_5O_{12}$:Ce, the optical wavelength conversion member being characterized in that:

A and B of $A_3B_5O_{12}$ individually represent at least one element selected from the following element groups:

A: Sc, Y, and lanthanoids (except for Ce), and

B: Al and Ga; and the Ce is present in each crystal grain and a crystal grain boundary of the ceramic sintered body, and a Ce concentration of the crystal grain boundary is higher than a Ce concentration of the crystal grain.

2. The optical wavelength conversion member according to claim 1, wherein the Ce concentration of the crystal grain and the Ce concentration of the crystal grain boundary are determined through continuous measurement in a specific straight-line region provided so as to include the crystal grain boundary and interiors of crystal grains located on opposite sides of the crystal grain boundary.

3. The optical wavelength conversion member according to claim 1, wherein the Ce concentration of the crystal grains of the component represented by the formula $A_3B_5O_{12}$:Ce is 10.0 mol % or less (exclusive of 0) relative to the element A.

4. The optical wavelength conversion member according to claim 1, wherein the ceramic sintered body contains the crystal grains of the component represented by the formula $A_3B_5O_{12}$:Ce in an amount of 3 to 70 vol. %.

5. A light-emitting device characterized by comprising the optical wavelength conversion member as recited in claim 1.

* * * * *